(12) United States Patent
Koury, Jr. et al.

(10) Patent No.: US 8,553,389 B1
(45) Date of Patent: Oct. 8, 2013

(54) ANCHOR DESIGN AND METHOD FOR MEMS TRANSDUCER APPARATUSES

(75) Inventors: Daniel N. Koury, Jr., Mesa, AZ (US); Anthony F. Flannery, Jr., Los Gatos, CA (US)

(73) Assignee: mCube Inc., San Jose, CA (US)

( * ) Notice: Subject to any disclaimer, the term of this patent is extended or adjusted under 35 U.S.C. 154(b) by 326 days.

(21) Appl. No.: 12/859,647

(22) Filed: Aug. 19, 2010

(51) Int. Cl.
*H01G 7/00* (2006.01)

(52) U.S. Cl.
USPC ........... 361/287; 361/280; 361/763; 361/769; 361/787; 361/807

(58) Field of Classification Search
USPC ... 361/280, 763, 769, 787, 807; 257/E21.19, 257/415, E21.5
See application file for complete search history.

(56) References Cited

U.S. PATENT DOCUMENTS

| | | | |
|---|---|---|---|
| 3,614,677 | A | 10/1971 | Wilfinger |
| 5,668,033 | A | 9/1997 | Ohara et al. |
| 6,188,322 | B1 | 2/2001 | Yao et al. |
| 6,979,872 | B2 | 12/2005 | Borwick et al. |
| 8,165,323 | B2* | 4/2012 | Zhou ............................ 381/174 |
| 2004/0002808 | A1 | 1/2004 | Hashimoto et al. |
| 2004/0016995 | A1 | 1/2004 | Kuo et al. |
| 2004/0113246 | A1 | 6/2004 | Boon |
| 2004/0227201 | A1 | 11/2004 | Borwick, III et al. |
| 2006/0049826 | A1 | 3/2006 | Daneman et al. |
| 2007/0181962 | A1 | 8/2007 | Partridge et al. |
| 2007/0281379 | A1 | 12/2007 | Stark et al. |
| 2009/0049911 | A1 | 2/2009 | Fukuda et al. |
| 2009/0262074 | A1 | 10/2009 | Nasiri et al. |
| 2010/0083756 | A1 | 4/2010 | Merz et al. |
| 2010/0236327 | A1 | 9/2010 | Mao |
| 2010/0248662 | A1 | 9/2010 | Sheynblat et al. |
| 2010/0260388 | A1 | 10/2010 | Garrett et al. |
| 2011/0154905 | A1 | 6/2011 | Hsu |
| 2011/0172918 | A1 | 7/2011 | Tome |
| 2011/0183456 | A1 | 7/2011 | Hsieh et al. |
| 2011/0265574 | A1 | 11/2011 | Yang |

OTHER PUBLICATIONS

Non-Final Office Action for U.S. Appl. No. 12/945,087, mailed on Mar. 19, 2012, 5 pages.
Non-Final Office Action for U.S. Appl. No. 12/913,440; mailed on Sep. 10, 2012; 13 pages total.
Notice of Allowance for U.S. Appl. No. 12/945,846, mailed on Aug. 9, 2012, 10 pages.
Non-Final Office Action for U.S. Appl. No. 12/859,672, mailed on Oct. 25, 2012, 16 pages.

(Continued)

*Primary Examiner* — Jayprakash N Gandhi
*Assistant Examiner* — Hung Dang
(74) *Attorney, Agent, or Firm* — Kilpatrick Townsend & Stockton LLP (57) ABSTRACT

An improved MEMS transducer apparatus and method is provided. The apparatus includes a movable base structure having a base surface region. An anchor structure is disposed within a substantially circular portion of the surface region typically at or near the center of the surface region. A spring structure is coupled to the anchor structure and at least one portion of the base surface region. A capacitor, having a fixed capacitor element and a movable capacitor element, are disposed near the base surface region. The fixed capacitor element can be coupled to the anchor structure and the movable capacitor element can be spatially disposed on a portion of the base surface region near the anchor structure.

19 Claims, 6 Drawing Sheets

(56) References Cited

OTHER PUBLICATIONS

Notice of Allowance for U.S. Appl. No. 12/945,087, mailed on Oct. 17, 2012, 8 pages.
Requirement for Restriction/Election for U.S. Appl. No. 12/859,631, mailed on Jul. 2, 2012, 7 pages.
Non-final office action for U.S. Appl. No. 12/913,440 (Jun. 11, 2013).
Non-final office action for U.S. Appl. No. 12/940,026 (Jun. 20, 2013).
Non-final office action for U.S. Appl. No. 13/069,355 (Jun. 27, 2013).
Non-final office action for U.S. Appl. No. 12/787,200 (Jun. 3, 2013).
Non-final office action for U.S. Appl. No. 13/164,311 (May 31, 2013).
Final office action for U.S. Appl. No. 12/983,309 (Apr. 25, 2013).
Notice of Allowance for U.S. Appl. No. 13/008,865 (Jul. 19, 2013).

* cited by examiner

ANCHOR DESIGN AND METHOD FOR MEMS TRANSDUCER APPARATUSES

BACKGROUND OF THE INVENTION

This invention relates generally to integrated devices. More specifically, the invention provides an integrated transducer apparatus that can be used in combination with other Micro-electromechanical systems (MEMS) devices, but can have other uses as well. For example, the MEMS devices can provide an accelerometer, an angular rate sensor, a magnetic field sensor, a pressure sensor, a microphone, a humidity sensor, a temperature sensor, a chemical sensor, a biosensor, an inertial sensor, and others.

Research and development in integrated microelectronics have continued to produce progress in CMOS and MEMS technology. CMOS technology has become the predominant fabrication technology for integrated circuits (ICs). In layman's terms, the ICs are the "brains" of an integrated device and provide decision-making capabilities, while MEMS are the "eyes" and "arms" and provide the ability to sense and control the environment. Some examples of the widespread application of these technologies are the switches in radio frequency (RF) antenna systems, such as those in the iPhone™ or iPad™ device by Apple, Inc. of Cupertino, Calif. and the Blackberry™ phone by Research In Motion Limited of Waterloo, Ontario, Canada. They are also used to provide accelerometers in sensor-equipped game devices, such as those in the Wii™ controller manufactured by Nintendo Company Limited of Japan. Though they are not always easily identifiable, these technologies are becoming more prevalent every day.

Beyond consumer electronics, use of IC and MEMS technology has applications through modular measurement devices such as accelerometers, angular rate sensors, actuators, and other sensors. In conventional vehicles, accelerometers and angular rate sensors are used to deploy airbags and trigger dynamic stability control functions, respectively. MEMS angular rate sensors can also be used for image stabilization systems in video and still cameras, automatic steering systems in airplanes and guided munitions, or the like. MEMS can also be in the form of biological MEMS (BioMEMS) that can be used to implement biological and/or chemical sensors for Lab-On-Chip applications. Such applications may integrate one or more laboratory functions on a single millimeter-sized chip. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Additionally, applications of MEMS often require increasingly complex microsystems that desire greater computational power. Unfortunately, such applications generally do not exist.

From the above, it is seen that techniques for improving operation of IC devices and MEMS are desired.

BRIEF SUMMARY OF THE INVENTION

This invention relates generally to integrated devices. More specifically, the invention provides an integrated transducer apparatus that can be used in combination with other Micro-electromechanical systems (MEMS) devices, but can have other uses as well. For example, the MEMS devices can provide an accelerometer, an angular rate sensor, a magnetic field sensor, a pressure sensor, a microphone, a humidity sensor, a temperature sensor, a chemical sensor, a biosensor, an inertial sensor, and others.

In a specific embodiment, the present invention provides an integrated transducer apparatus disposed upon a substrate member having a surface region. The apparatus has a movable base structure having a base surface region. At least one anchor structure can be disposed within a substantially circular portion of the surface region. The substantially circular portion can be configured within a vicinity of the center of the surface region. At least one spring structure can be coupled to the anchor structure(s) and at least one portion of the base surface region. At least one capacitor element, having a fixed capacitor element and a movable capacitor element, can also be spatially disposed within a vicinity of the base surface region. The fixed capacitor element(s) can be coupled to the anchor structure(s) and the movable capacitor element(s) can be spatially disposed on a portion of the base surface region within a vicinity of the anchor structure(s). The anchor(s) for the fixed capacitor elements present and the anchor(s) for the spring elements present can all be disposed within the substantially circular portion of the surface region. The smaller the circular portion can be made, the less sensitive the MEMS device will be to external deformations.

A substantially circular shape for the portion can reduce and/or minimize the separation that is possible between any two anchors or any two locations within a single anchor. Depending on the specific design, the substantially circular portion shape can typically be approximated by a polygon. For example, an octagon is much closer to a circle than a square, but not as close as a dodecagon. The technology will typically not be able to reproduce a true circle, however.

Many benefits are achieved by way of the present invention over conventional techniques. For example, the present technique provides an easy to use process that relies upon conventional technology. In some embodiments, the present invention provides improved tolerance of external deformations. Additionally, the method provides a process and apparatus that are compatible with conventional process technology without substantial modifications to conventional equipment and processes. Preferably, the invention provides for an improved MEMS device apparatus and related applications for a variety of uses. In other embodiments, the present invention provides an improved MEMS transducer apparatus, which may be integrated on at least one integrated electronic device structure. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow

BRIEF DESCRIPTION OF THE DRAWINGS

The diagrams disclosed in the present patent application are implementation examples, which should not unduly limit the scope of the claims herein. The examples and embodiments described herein are for illustrative purposes only and various modifications or changes in light thereof will be suggested to persons skilled in the art and are to be included within the spirit and purview of this process and scope of the appended claims.

DETAILED DESCRIPTION OF THE INVENTION

Figure 1:
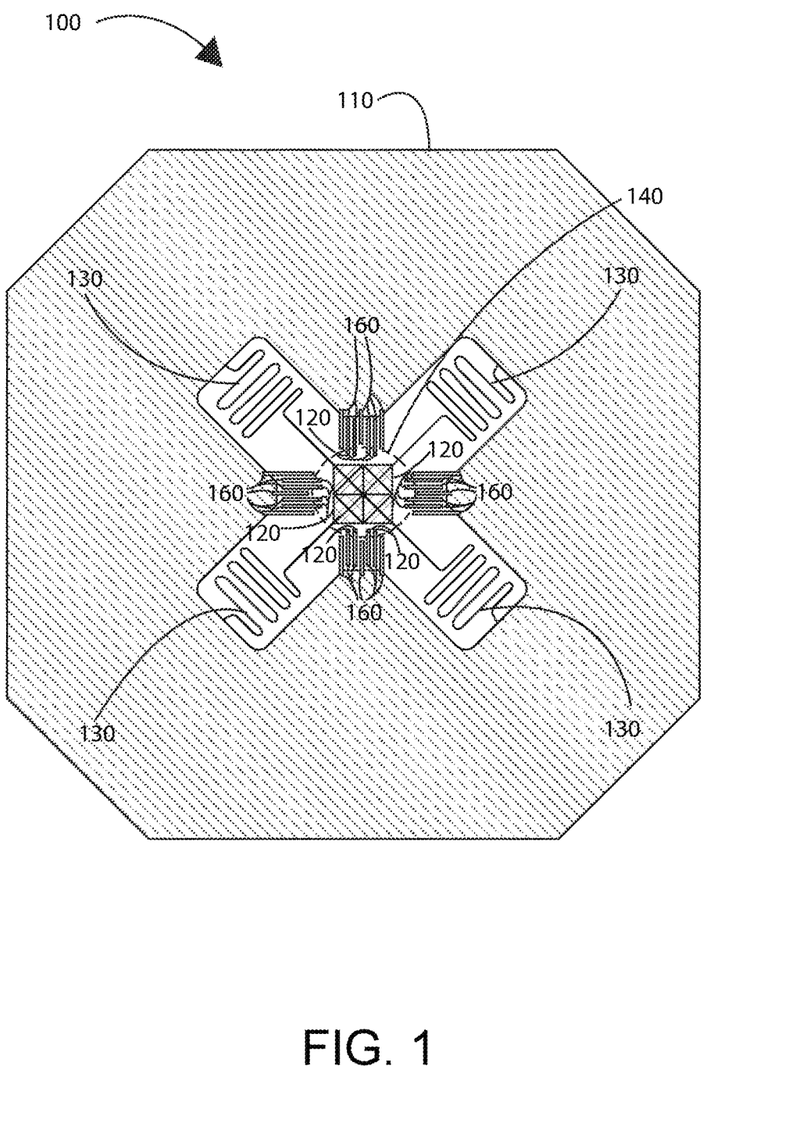
FIG. 1 is a simplified top diagram of a transducer apparatus according to an embodiment of the present invention.

This invention provides an improved MEMS transducer apparatus that can be used with other MEMS devices, as well as other devices. FIG. 1 is a simplified top diagram of a transducer apparatus disposed on a substrate having a surface region according to an embodiment of the present invention. As shown, apparatus 100 includes a movable base structure 110, at least one anchor structure 120, at least one spring structure 150, and at least one capacitor element 160. In an embodiment, apparatus 100 can be configured to improve tolerance of external deformations.

In an embodiment, movable base structure 110 can have an base surface region and at least one portion removed by an etching, mechanical, or other process. In a specific embodiment, movable base structure 110 can be fabricated from a single crystal silicon, polycrystalline silicon, amorphous silicon, or the like. Moveable base structure 110 can also include a thickness of a polymer or a thickness of a metal material. In other embodiments, movable base structure 110 can include other materials and combinations thereof. In a specific embodiment, movable base structure 110 can be a rectangular movable base structure, a patterned polygonal base structure, or virtually any other shaped base structure. Also, various portions of the movable base structure can be etched to at least one inner surface region.

Figure 4:
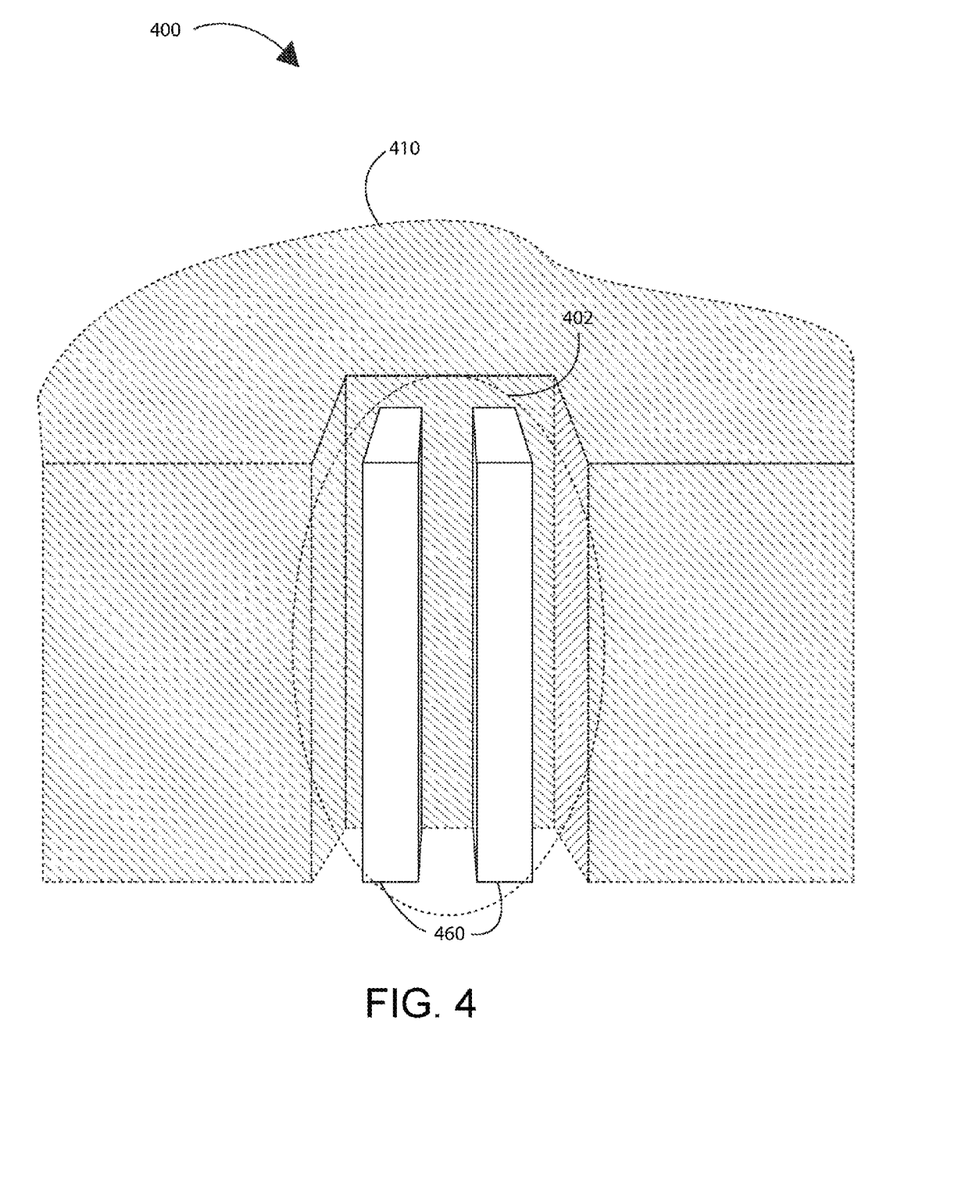
FIG. 4 is a simplified cross-sectional close-up diagram of a transducer apparatus according to an embodiment of the present invention.

In an embodiment, capacitor element(s) 460 can include a fixed capacitor element and a movable capacitor element. The fixed capacitor element(s) can be coupled to the anchor structure(s) and the movable capacitor element(s) can be spatially disposed on a portion of the base surface region within a vicinity of the anchor structure(s). The capacitor element(s) can be tall vertical structures, which can include silicon materials and the like. In an embodiment, apparatus 400 can be configured to improve tolerance of external deformations. Capacitor element(s) 460 can be spatially disposed within a vicinity of inner surface region(s) 402 of the movable base structure. Capacitor element(s) 460 can also include differential capacitor element pair(s). In a specific embodiment, the differential capacitor element pair(s) can operate during motion of movable base structure 410. The charge on one element of the pair can increase while the charge on the other complementary element can decrease. Each differential pair can also be spatially disposed within a vicinity of inner surface region(s) 402, and each pair can be disposed within a vicinity of its own inner surface region, isolated from other pairs.

In various embodiment, anchor structure(s) 120 can be restricted to be spatially disposed within a substantially circular portion of the surface region. Anchor structure(s) 120 can also be configured within a vicinity of the center of the surface region. In a specific embodiment, anchor structure(s) 120 can include single crystal silicon, polycrystalline silicon, or amorphous silicon. Anchor structure(s) 120 can also include a polymer or metal material, or other materials or combinations thereof. In various embodiments, anchor structure(s) 120 can be formed overlying an oxide material, which can be formed overlying the substrate. In various embodiments, various portions of the oxide material are etched to form a space between movable base structure 100 and the substrate.

In an embodiment, spring structure(s) 130 can be operably coupled to the anchor structure(s) 120 and at least one portion of the base surface region of movable base structure 110. In a specific embodiment, spring structure(s) 130 can be formed from single crystal silicon, polycrystalline silicon, amorphous silicon, or the like. Spring structure(s) 130 can also include a polymer or metal material, or other materials or combinations thereof. In a specific embodiment, spring structure(s) 130 can be spatially oriented to be 45 degrees or (pi/4) radians to the edges of a die. Thus, spring structure(s) 130 would be diagonally aligned to the center of movable base structure 110. Also, each of spring structure(s) 130 can have at least one segment having a segment length. Each of the segments of spring structure(s) 130 can be separated by folds, as shown in FIG. 1.

In an embodiment, apparatus 100 can include at least one capacitor element spatially disposed within a vicinity of the base surface region of movable base structure 110. Also, the configuration of spring structure(s) 130 can depend on the configuration of the capacitor element(s). The capacitor element(s) can include a fixed capacitor element and a movable capacitor element. The movable capacitor element can be disposed on a portion of the movable base structure and the fixed capacitor element can be disposed on a portion of the anchor structure(s). In a specific embodiment, the physical basis of apparatus 100 is to have anchor(s) 120 for spring structure(s) 130 and the anchor(s) for the fixed capacitor elements be located as close as possible to each other so that their deformations will be nearly the same.

In an embodiment, apparatus 100 can be coupled to another MEMS device or an electronic device. In a specific embodiment, apparatus 100 can be configured to be tolerant of external deformations. Apparatus 100 can be an integrated transducer apparatus with minimal separation between anchor structure(s) 120 and thus minimal difference of strain or deformation of the anchor structure(s). In some embodiments, this configuration can result in minimal change in sense capacitance values over strain and deformation due to temperature.

Figure 2:
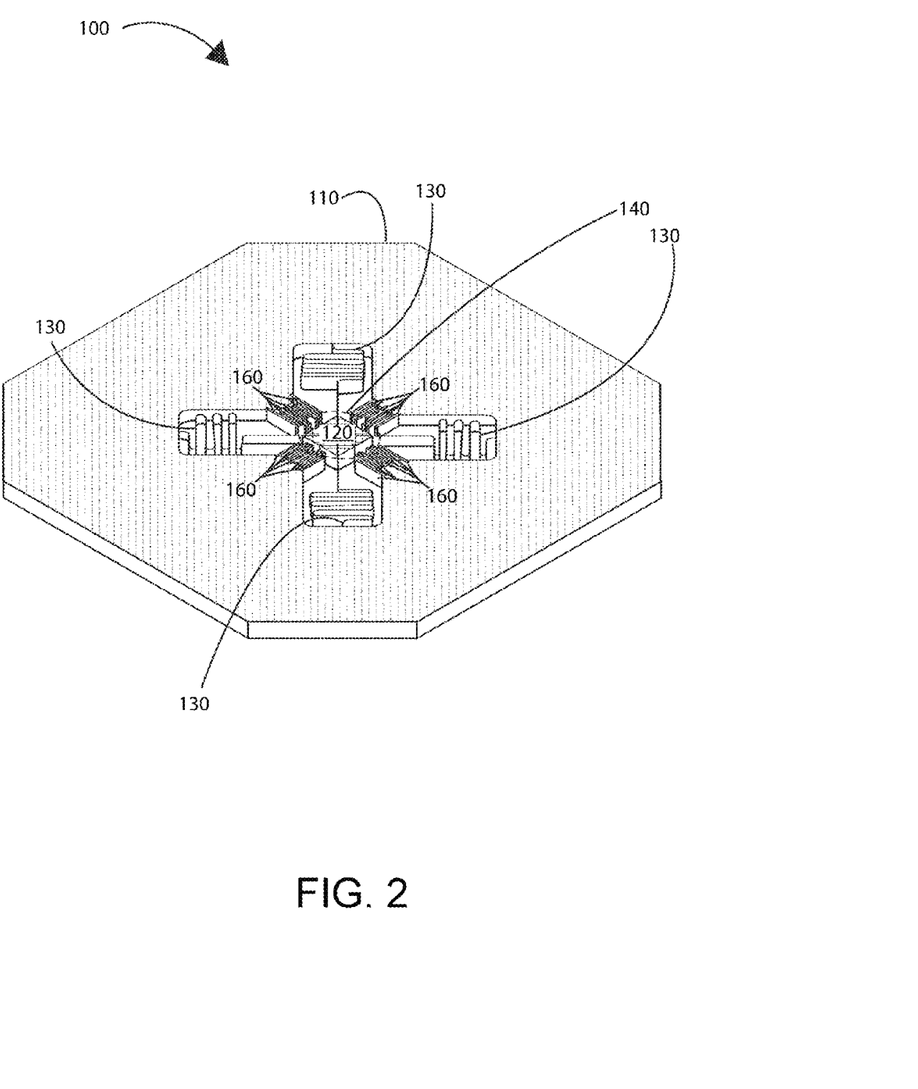
FIG. 2 is a simplified perspective diagram of a transducer apparatus according to an embodiment of the present invention.

FIG. 2 is a simplified perspective diagram of a transducer apparatus according to an embodiment of the present invention. As shown, apparatus 100 includes a movable base structure 110, at least one anchor structure 120, at least one spring structure 130, and at least one capacitor element 160. In an embodiment, apparatus 100 can be configured to improve tolerance of external deformations. A detailed description regarding the elements and configuration of apparatus 100 can be found above in the description for FIG. 1.

In an embodiment, the present apparatus can include a movable base structure having a base surface region. The movable base can have a center cavity with a cavity surface region. At least one center anchor structure can be spatially disposed within a substantially circular portion of the surface region of the substrate. These anchor structure(s) can be configured within a vicinity of the center of the surface region that is within the center cavity. At least one spring structure can be coupled to at least one portion of the cavity surface region and the center anchor structure(s). At least one capacitor element, which can include a fixed and a movable capacitor element, can be coupled to the center anchor structure(s), with the movable capacitor elements disposed on a portion of the cavity surface region and the fixed capacitor elements being coupled to the center anchor structure(s).

In a specific embodiment, the present apparatus can include a rectangular movable base structure having a base surface region. The rectangular movable base can have a center cavity with a cavity surface region. Four anchor structures can be spatially disposed within a substantially circular portion of the surface region of the substrate. These anchor structures can be configured within a vicinity of the center of the surface region that is within the center cavity. Four spring structure can be coupled to separate portions of the cavity surface region and to the center anchor structures. At least one capacitor element, which can include a fixed and a movable capacitor element, can be coupled to each of the center anchor structures, with the movable capacitor elements disposed on a portion of the cavity surface region and the fixed capacitor elements being coupled to the center anchor structures.

Figure 3:
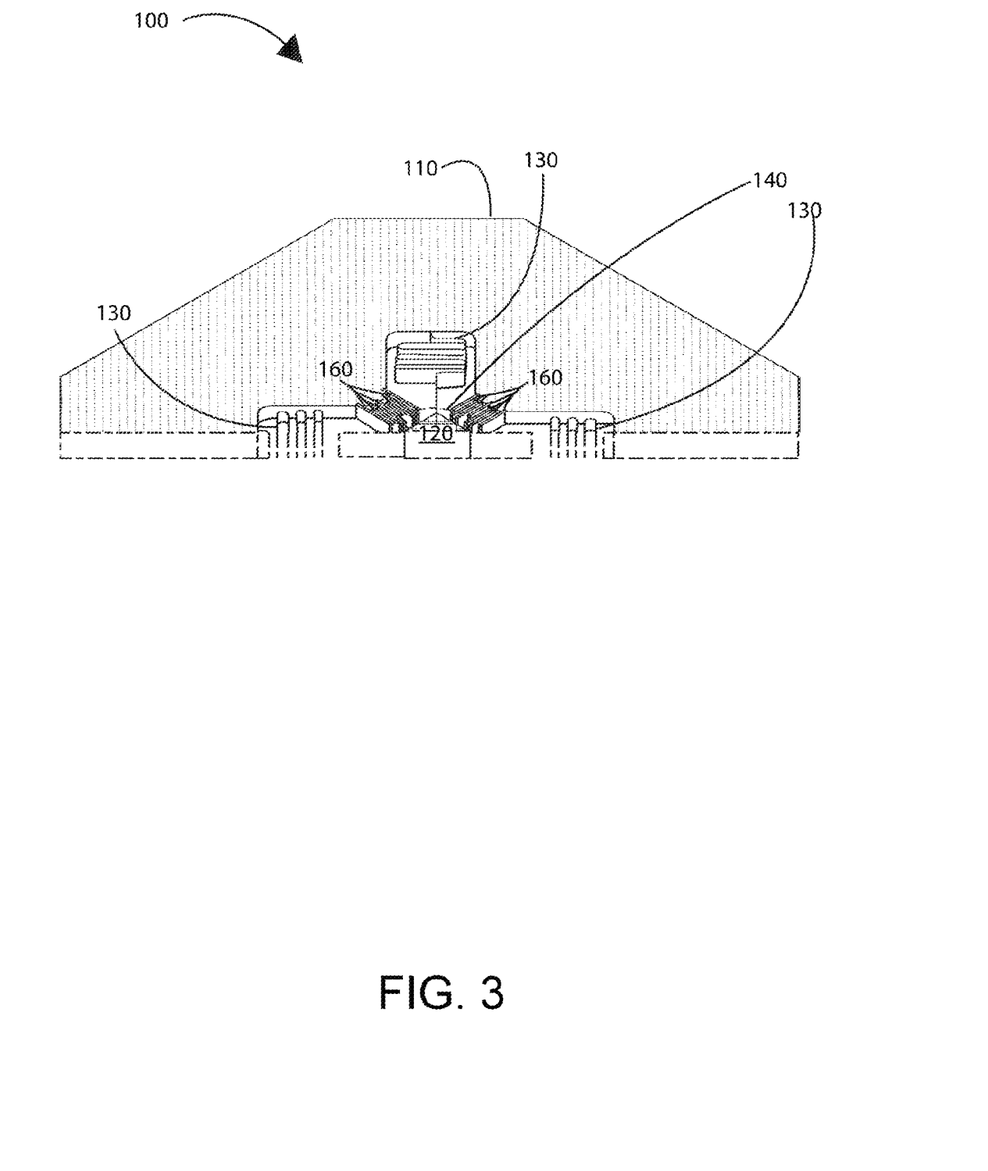
FIG. 3 is a simplified cross-sectional side diagram of a transducer apparatus according to an embodiment of the present invention.

FIG. 3 is a simplified cross-sectional side diagram of a transducer apparatus according to an embodiment of the present invention. As shown, apparatus 100 includes a movable base structure 110, at least one anchor structure 120, at least spring structure 130, and at least one capacitor element 160. In an embodiment, apparatus 100 can be configured to improve tolerance of external deformations. A detailed description regarding the elements and configuration of apparatus 100 can be found above in the description for FIG. 1.

FIG. 4 is a simplified cross-sectional close-up diagram of a transducer apparatus according to an embodiment of the present invention. As shown, apparatus 400 includes a movable base structure 410 and at least one capacitor element 460. In an embodiment, capacitor element(s) 460 can include a fixed capacitor element and a movable capacitor element. The fixed capacitor element(s) can be coupled to the anchor structure(s) and the movable capacitor element(s) can be spatially disposed on a portion of the base surface region within a vicinity of the anchor structure(s). The capacitor element(s) can be tall vertical structures, which can include silicon materials and the like. In an embodiment, apparatus 400 can be configured to improve tolerance of external deformations. Capacitor element(s) 460 can be spatially disposed within a vicinity of inner surface region(s) 402 of the movable base structure. Capacitor element(s) 460 can also include differential capacitor element pair(s). In a specific embodiment, the differential capacitor element pair(s) can operate during motion of movable base structure 410. The charge on one element of the pair can increase while the charge on the other complementary element can decrease. Each differential pair can also be spatially disposed within a vicinity of inner surface region(s) 402, and each pair can be disposed within a vicinity of its own inner surface region, isolated from other pairs. A detailed description regarding the components and configuration of apparatus 400 can be found above in the description for FIG. 1.

Figure 5:
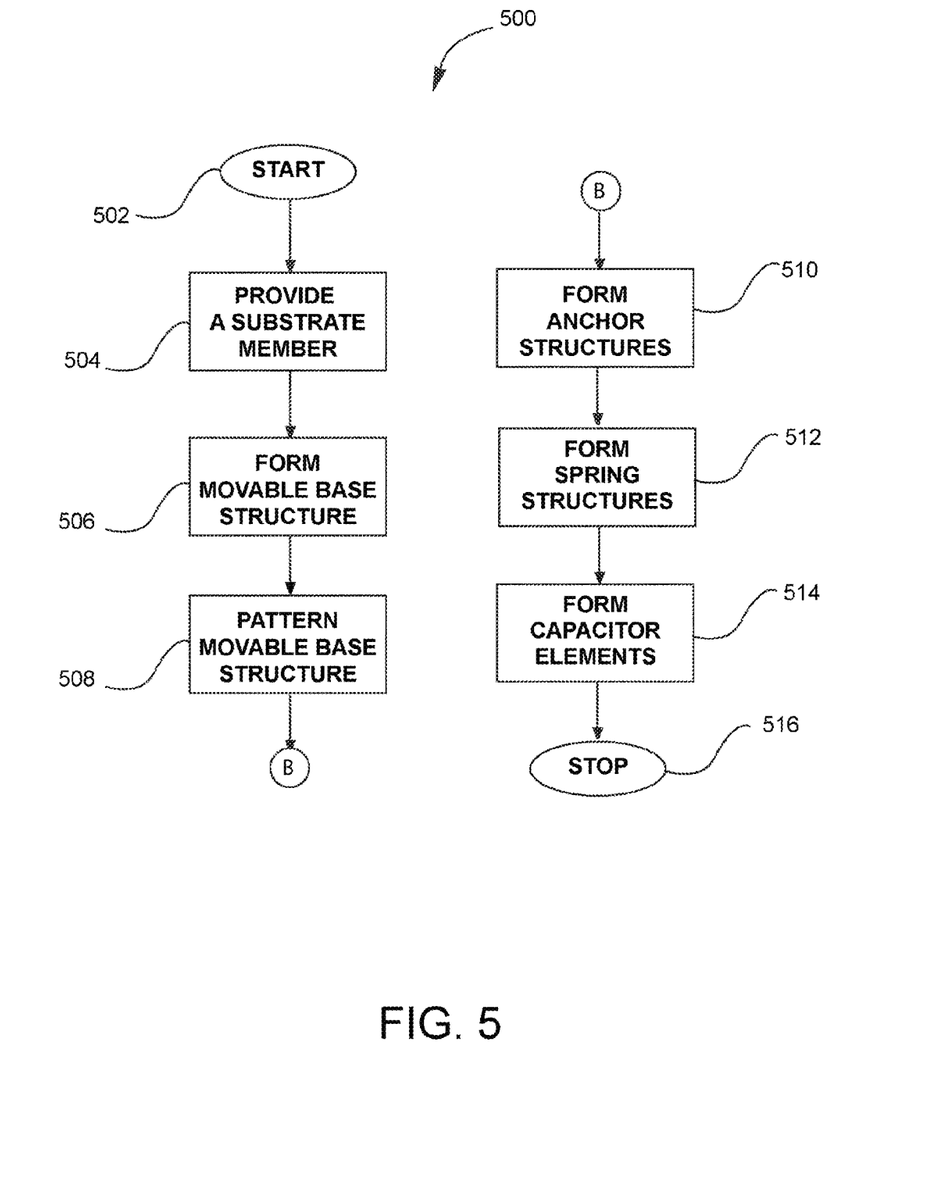
FIG. 5 is a simplified flow diagram of a transducer apparatus according to an embodiment of the present invention.

FIG. 5 is a simplified flow diagram illustrating a method for fabricating a transducer apparatus according to an embodiment of the present invention.

As shown in FIG. 5, the present method can be briefly outlined below.
1. Start;
2. Provide a substrate member;
3. Form a movable base structure;
4. Pattern the movable base structure
5. Form at least one anchor structure;
6. Form at least one spring structure;
7. Form at least one capacitor element; and
8. Stop.

These steps are of a preferred implementation and should not unduly limit the scope of the claims herein. As shown, the above method provides a way of fabricating a transducer apparatus according to an embodiment of the present invention.

As shown in FIG. 5, method 500 begins at start, step 502. The present method provides a fabrication method for forming a MEMS transducer apparatus. Many benefits are achieved by way of the present invention over conventional techniques. For example, the present technique provides an easy to use process that relies upon conventional technology. In some embodiments, the present invention provides improved tolerance of external deformations. Additionally, the method provides a process and system that are compatible with conventional process technology without substantial modifications to conventional equipment and processes. Preferably, the invention provides for an improved integrated micro electro-mechanical systems and electronic devices and related methods for a variety of uses.

Following step 502, a substrate member having a surface region can be provided, step 504. The substrate member can include single crystal, polycrystalline, or amorphous silicon. A movable base structure can be formed overlying the surface region, step 506, which can have a base surface region. In a specific embodiment, the movable base structure can include a single crystal silicon, polycrystalline silicon, or amorphous silicon. The moveable base structure can also include a thickness of a polymer or a thickness of a metal material. In other embodiments, the movable base structure can include other materials and combinations thereof. Additionally, the movable base structure can have at least one portion removed by an etching process, mechanical process, or other process, step 508. Etching the movable base structure can form at least one inner surface region where portions are removed.

Next, at least one anchor structure can be formed and spatially disposed within a substantially circular portion of the surface region, step 510. The anchor structures can also be configured within a vicinity of the center of the surface. In a specific embodiment, the anchor structure(s) can include single crystal silicon, polycrystalline silicon, or amorphous silicon. The anchor structures can also include a polymer or metal material, or other materials or combinations thereof.

After forming the anchor structure(s), at least one spring structure can be formed and operably coupled to the anchor structure(s) and at least one portion of the base surface region(s) of movable base structure, step 512. In a specific embodiment, the spring structure(s) can include single crystal silicon, polycrystalline silicon, or amorphous silicon. The spring structures can also include a polymer or metal material, or other materials or combinations thereof. In a specific embodiment, the spring structure(s) can be spatially oriented to be 45 degrees or (pi/4) radians to the edges of a die.

At least one capacitor element can be formed spatially disposed within a vicinity of the base surface region of the movable base structure, step 518. In a specific embodiment, the number of the spring structure(s) can be proportional to the number of the capacitor element(s). Also, the configuration of the central spring structure(s) can depend on the configuration of the capacitor element(s). The capacitor element(s) can include a fixed capacitor element and a movable capacitor element. The fixed capacitor element(s) can be coupled to the anchor structure(s) and the movable capacitor element(s) can be spatially disposed on a portion of the base surface region within a vicinity of the anchor structure(s). In a specific embodiment, the physical basis of method 500 is to have the anchor(s) for the spring structure(s) and the anchor(s) for the fixed capacitor elements be located as close as possible to each other so that their deformations will be nearly the same. In a specific embodiment, the differential capacitor element pair(s) can operate during motion of the movable base structure. The charge on one element of the pair can increase while the charge on the other complementary element can decrease. Each differential pair can also be spatially disposed within a vicinity of the inner surface region(s), and each pair can be disposed within a vicinity of its own inner surface region, isolated from other pairs.

In an embodiment, the apparatus can be coupled to another MEMS device or an electronic device. In a specific embodiment, the apparatus can be configured to be tolerant of external deformations. The apparatus formed by method 500 can be an integrated transducer apparatus with minimal separation between anchor structures and thus minimal difference of strain or deformation of the anchor structure(s). In some embodiments, this configuration can result in minimal change in sense capacitance values over strain and deformation due to temperature. There can be other variations, modifications, and alternatives as well.

The above sequence of processes provides a fabrication method for forming a MEMS transducer apparatus according to an embodiment of the present invention. As shown, the method uses a combination of steps including providing a substrate member, forming a movable base, removing a portion of the base, forming anchor structure(s), forming spring structure(s), and forming capacitor element(s).

Figure 6:
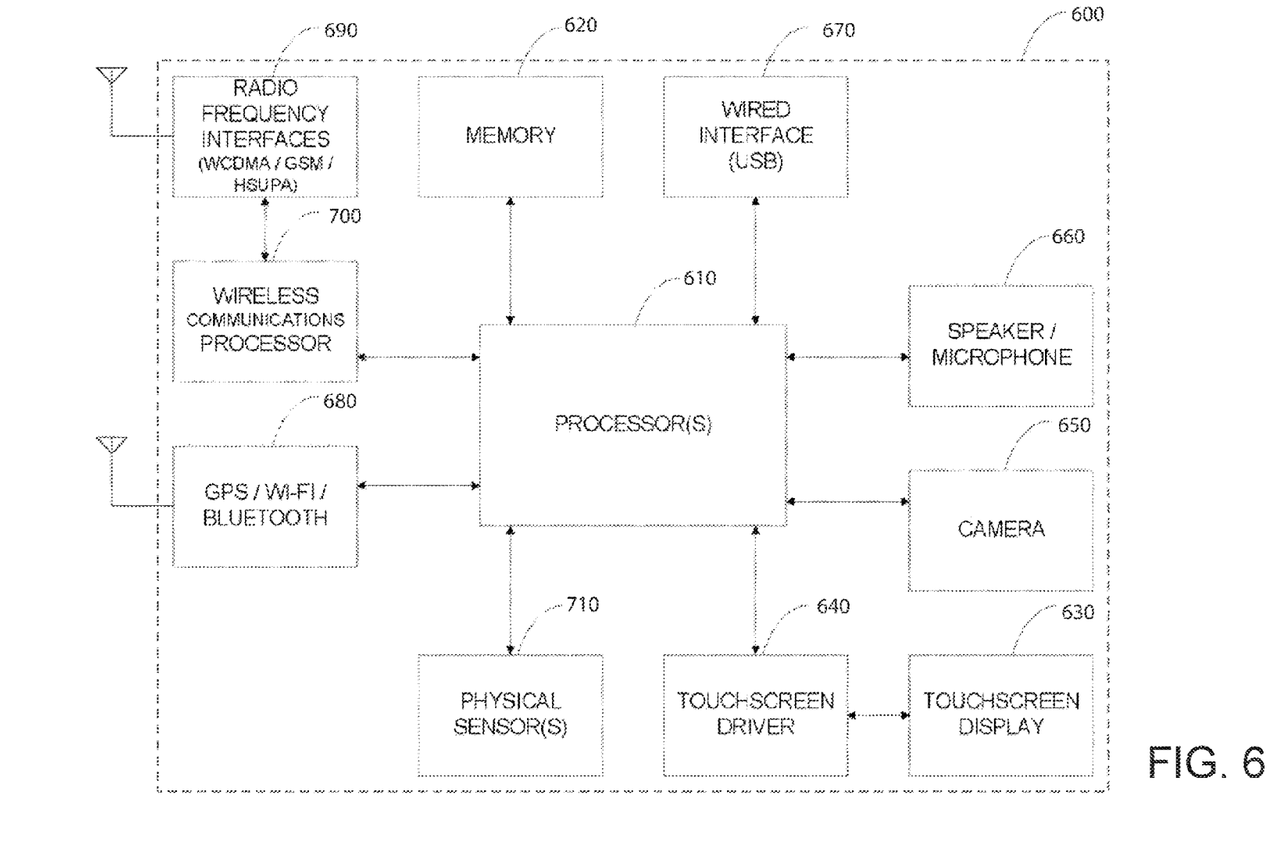
FIG. 6 is a simplified block diagram of a device incorporating various embodiments of the present invention.

FIG. 6 illustrates a functional block diagram of various embodiments of the present invention. In FIG. 6, a computing device 600 typically includes an applications processor 610, memory 620, a touch screen display 630 and driver 640, an image acquisition device 650, audio input/output devices 660, and the like. Additional communications from and to computing device are typically provided by via a wired interface 670, a GPS/Wi-Fi/Bluetooth interface 680, RF interfaces 690 and driver 700, and the like. Also included in various embodiments are physical sensors 710.

In various embodiments, computing device 600 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 600 may include one or more processors 610. Such processors 610 may also be termed application processors, and may include a processor core, a video/graphics core, and other cores. Processors 610 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 620 may include different types of memory (including memory controllers), such as flash memory (e.g. NOR, NAND), pseudo SRAM, DDR SDRAM, or the like. Memory 620 may be fixed within computing device 600 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 630 and driver 640 may be based upon a variety of later-developed or current touch screen technology including resistive displays, capacitive displays, optical sensor displays, electromagnetic resonance, or the like. Additionally, touch screen display 630 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 650 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 660 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 610 to enable the user to operate computing device 600 by stating voice commands. Additionally, a speech engine may be provided in various embodiments to enable computing device 600 to provide audio status messages, audio response messages, or the like.

In various embodiments, wired interface 670 may be used to provide data transfers between computing device 600 and an external source, such as a computer, a remote server, a storage network, another computing device 600, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 680 may also be provided to provide wireless data transfers between computing device 600 and external sources, such as computers, storage networks, headphones, microphones, cameras, or the like. As illustrated in FIG. 6, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 6, GPS functionality is included as part of wireless interface 180 merely for sake of convenience, although in implementation, such functionality is currently performed by circuitry that is distinct from the Wi-Fi circuitry and distinct from the Bluetooth circuitry.

Additional wireless communications may be provided via RF interfaces 690 and drivers 700 in various embodiments. In various embodiments, RF interfaces 690 may support any future-developed or conventional radio frequency communications protocol, such as CDMA-based protocols (e.g. WCDMA), GSM-based protocols, HSUPA-based protocols, or the like. In the embodiments illustrated, driver 700 is illustrated as being distinct from applications processor 610. However, in some embodiments, these functionality are provided upon a single IC package, for example the Marvel PXA330 processor, and the like. It is contemplated that some embodiments of computing device 600 need not include the RF functionality provided by RF interface 690 and driver 700.

FIG. 6 also illustrates computing device 600 to include physical sensors 710. In various embodiments of the present invention, physical sensors 710 can be single axis or multi-axis Micro-Electro-Mechanical Systems (MEMS) based devices being developed by M-cube, the assignee of the present patent application. Physical sensors 710 can include accelerometers, gyroscopes, pressure sensors, magnetic field sensors, bio sensors, and the like. In other embodiments of the present invention, conventional physical sensors 710 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 630 and driver 640 and inputs/or outputs to physical sensors 710 may be processed in parallel processing threads. In other embodiments, such events or outputs may be processed serially, or the like. Inputs and outputs from other functional blocks may also be processed in parallel or serially, in other embodiments of the present invention, such as image acquisition device 650 and physical sensors 710.

FIG. 6 is representative of one computing device 600 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 6. For example, in various embodiments, computing device 600 may lack image acquisition unit 650, or RF interface 690 and/or driver 700, or GPS capability, or the like. Additional functions may also be added to various embodiments of computing device 600, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. An apparatus disposed upon a substrate member having a surface region, the apparatus comprising:
   a movable base structure having a base surface region, the movable base structure having a center cavity with a cavity surface region;
   at least one center anchor structure spatially disposed within a substantially circular portion of the surface region, the anchor structure(s) being configured within a vicinity of the center of the surface region that is within the center cavity;
   at least one spring structure coupled to at least one portion of the cavity surface region, the spring structure(s) being coupled to the center anchor structure(s); and
   at least one capacitor element, the capacitor element(s) being spatially disposed within a vicinity of the anchor structure(s), each of the capacitor element(s) having a fixed capacitor element and a movable capacitor element, the fixed capacitor element(s) being coupled to the center anchor structure(s), the movable capacitor element(s) being spatially disposed on a portion of the cavity surface region within a vicinity of the center anchor structure(s).

2. The apparatus of claim 1 wherein each of the capacitor element(s) comprises a differential capacitor element pair.

3. The apparatus of claim 1 wherein the capacitor element(s) comprise a silicon material, a dielectric, a polymer, or metal material.

4. The apparatus of claim 1 wherein the capacitor element(s) are spatially disposed within a substantially circular portion of the surface region, the capacitor element(s) being configured within a vicinity of the center of the surface region within the center cavity.

5. The apparatus of claim 1 wherein the movable base structure comprises a silicon material, a polymer, a dielectric, or a metal material.

6. The apparatus of claim 1 wherein the anchor structure(s) comprise a silicon material, a polymer, a dielectric, or a metal material.

7. The apparatus of claim 1 wherein the anchor structure(s) are formed overlying an oxide material overlying the substrate.

8. The apparatus of claim 1 wherein the anchor structure(s) are configured such that the maximum distance between each anchor structure is minimized.

9. The apparatus of claim 1 wherein the anchor structure(s) are configured such that the apparatus is tolerant of strain or deformation over temperature.

10. The apparatus of claim 1 wherein the spring structure(s) comprise a silicon material, a polymer, a dielectric, or a metal material.

11. An apparatus disposed upon a substrate member having a surface region, the apparatus comprising:
    a rectangular movable base structure having a base surface region, the rectangular movable base structure having a center cavity with a cavity surface region;
    four center anchor structures spatially disposed within a substantially circular portion of the surface region, the center anchor structures being configured within a vicinity of the center of the surface region within the center cavity;

four spring structures each of which are coupled to separate at least portions of the cavity surface region, the spring structures being coupled to the center anchor structures; and at least one capacitor element coupled to each of the center anchor structures, the capacitor elements being spatially disposed within a vicinity of the substantially circular portion within the center cavity, each of the capacitor elements having a fixed capacitor element and a movable capacitor element, the fixed capacitor elements being coupled to the center anchor structures within a vicinity of the center of the substantially circular portion, the movable capacitor elements being spatially disposed on a portion of the cavity surface region within a vicinity of the center anchor structures and outside of the substantially circular portion.

12. The apparatus of claim 11 wherein each of the capacitor elements comprises a differential capacitor element pair.

13. The apparatus of claim 11 wherein the capacitor elements comprise a silicon material, a dielectric, a polymer, or metal material.

14. The apparatus of claim 11 wherein the rectangular movable base structure comprises a silicon material, a polymer, a dielectric, or a metal material.

15. The apparatus of claim 11 wherein the center anchor structures comprise a silicon material, a polymer, a dielectric, or a metal material.

16. The apparatus of claim 11 wherein the center anchor structures are configured such that the maximum distance between each center anchor structure is minimized.

17. The apparatus of claim 11 wherein the center anchor structures are configured such that the apparatus is tolerant of strain or deformation over temperature.

18. The apparatus of claim 11 wherein the spring structures comprise a silicon material, a polymer, a dielectric, or a metal material.

19. The apparatus of claim 11 wherein the spring structures comprise torsion springs or bending springs.

* * * * *